(12) United States Patent
Maehara et al.

(10) Patent No.: US 6,570,470 B2
(45) Date of Patent: May 27, 2003

(54) SURFACE ACOUSTIC WAVE LADDER FILTER UTILIZING PARALLEL RESONATORS WITH DIFFERENT RESONANT FREQUENCIES

(75) Inventors: Hiroaki Maehara, Kokubu (JP); Yuuji Mizutani, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/895,847

(22) Filed: Jun. 29, 2001

(65) Prior Publication Data

US 2002/0021194 A1 Feb. 21, 2002

(30) Foreign Application Priority Data

Jun. 30, 2000 (JP) .......................................... 2000-199132
Nov. 30, 2000 (JP) .......................................... 2000-365616

(51) Int. Cl.[7] ................................................. H03H 9/64
(52) U.S. Cl. ...................... 333/193; 333/195; 310/313 B
(58) Field of Search ................................. 333/193–196; 310/313 BR

(56) References Cited

U.S. PATENT DOCUMENTS

| | | | | |
|---|---|---|---|---|
| 5,471,178 A | * | 11/1995 | Hickernell | 333/193 |
| 5,638,036 A | * | 6/1997 | Penunuri et al. | 333/195 X |
| 5,654,680 A | * | 8/1997 | Kwan et al. | 333/195 |
| 5,831,493 A | * | 11/1998 | Ushiroku | 333/193 |
| 6,201,457 B1 | * | 3/2001 | Hickernell | 333/195 X |
| 6,208,223 B1 | * | 3/2001 | Shimamura et al. | 333/193 |
| 6,208,224 B1 | * | 3/2001 | Taniguchi et al. | 333/193 |
| 6,351,197 B1 | * | 2/2002 | Selmeier et al. | 333/195 |

FOREIGN PATENT DOCUMENTS

| | | |
|---|---|---|
| JP | 5-183380 | 7/1993 |
| JP | 9-232906 | 9/1997 |
| JP | 10-242799 | * 9/1998 |
| JP | 10-335965 | * 12/1998 |
| JP | 11-055067 | 2/1999 |
| JP | 2000-341086 | * 12/2000 |
| JP | 2001-144585 | * 5/2001 |

* cited by examiner

*Primary Examiner*—Barbara Summons
(74) *Attorney, Agent, or Firm*—Hogan & Hartson, LLP

(57) ABSTRACT

A surface acoustic wave filter has a series resonator group and a parallel resonator group. The series resonator group includes a plurality of surface acoustic wave electrodes formed on a surface of a piezoelectric substrate and electrically disposed in series between an input terminal and an output terminal. The parallel resonator group includes a plurality of surface acoustic wave electrodes individually electrically disposed in parallel between an input- or output- terminal of the individual surface acoustic wave electrodes of the series resonator group and a ground electrode. A part number of the surface acoustic electrodes of the parallel resonator group is configured to deteriorate an obtained Q value and presents a resonant frequency which is lower than an antiresonant frequency and higher than a resonant frequency respectively formed by the other surface acoustic wave electrodes of the parallel resonator group.

7 Claims, 7 Drawing Sheets

SURFACE ACOUSTIC WAVE LADDER FILTER UTILIZING PARALLEL RESONATORS WITH DIFFERENT RESONANT FREQUENCIES

This application is based on application Nos.2000-199132, 2000-365616 filed in Japan, the content of which is incorporated herein by reference.

BACKGROUND OF THE INVENTION

1. Field of the Invention

The present invention relates to a surface acoustic wave filter comprising a plurality of surface acoustic wave electrodes arranged on a piezoelectric substrate in a ladder fashion, and more particularly to a surface acoustic wave filter featuring an improved shoulder characteristic curve on a lower frequency of the passband of the filter.

2. Description of the Related Art

As a high-frequency bandpass filter for use in mobile communications devices, the surface acoustic wave filter has been known which comprises a plurality of surface acoustic wave electrodes arranged on the piezoelectric substrate. For instance, there has been disclosed in Japanese Unexamined Patent Publication No.5(1993)-183380 a surface acoustic wave filter wherein a plurality of surface acoustic wave electrodes are arranged on a piezoelectric substrate to define a ladder filter circuit thereon.

FIG. 8 is a schematic circuit diagram for illustrating the surface acoustic wave filter disclosed by the aforesaid prior art.

This surface acoustic wave filter 510 comprises a rectangular piezoelectric substrate 520, on which resonators 530, 540, 550, 560 comprised of surface acoustic wave electrodes are arranged.

As seen in FIG. 8, the resonators 530, 540 are connected in series to form a series arm between an input terminal 570 and an output terminal 580 (hereinafter, the resonators 530, 540 each referred to as "a series resonator" and collectively referred to as "a series resonator group"). On the other hand, the resonators 550, 560 are electrically disposed in parallel between the series arm and a ground electrode 590 (hereinafter, the resonators 550, 560 each referred to as "a parallel resonator" and collectively referred to as "a parallel resonator group"). The series resonators 530, 540 and the parallel resonators 550, 560 are alternatively arranged between the input terminal and the output terminal. The parallel resonators are connected to the ground electrode 590 via inductors 555, 565, respectively.

The series resonator 530 and the parallel resonator 550 are paired to define a one-stage ladder filter. Likewise, the series resonator 540 and the parallel resonator 560 are paired to define a one-stage ladder filter.

The surface acoustic wave filter 510 operates as follows. FIG. 9 is a diagram for explaining a configuration of the surface acoustic wave electrode constituting each of the series or parallel resonators 530–560. FIG. 9 schematically illustrates only an electrode portion of a one-port surface acoustic wave resonator.

In FIG. 9, indicated at 700 is a surface acoustic wave electrode. The electrode 700 has a configuration wherein an interdigital transducer (IDT) 710 is sandwiched between reflectors 720, 730.

The IDT 710 has a configuration wherein a comb electrode 710a having a plurality of electrode fingers 711 and a comb electrode 710b having a plurality of electrode fingers 712 are arranged in such a manner that the electrode fingers 711 are interdigitated with the electrode fingers 712. In this configuration, the comb electrode 710a is connected between an input electrode and an output electrode whereas the comb electrode 710b is connected to the ground electrode, for example.

A surface acoustic wave is excited by a signal inputted to the IDT 710 of the surface acoustic wave electrode 700 thus configured. The excited wave is reflected by the reflectors 720, 730 to form a standing wave which is trapped between the reflectors 720, 730. Thus, the surface acoustic wave electrode 700 operates as a resonator having a high Q value. As is well known, the surface acoustic wave electrode 700 has such impedance characteristics that there exists a pole lowered in impedance by a resonant frequency while there appears a pole increased in impedance by an antiresonant frequency.

The surface acoustic wave filter 510 having the series and parallel resonators 530–560 of such a configuration utilizes the impedance characteristics of the surface acoustic wave electrode 700 for obtaining a passband of a desired bandwidth. More specifically, the resonant frequency of the series resonators 530, 540 and the antiresonant frequency of the parallel resonators 530, 540 are substantially set equal to each other thereby to match the output/input impedance with the characteristic impedance near these frequencies. Thus is established the passband.

Particularly in the ladder filter circuit, the surface acoustic wave electrode 700 has a predetermined impedance characteristic. Therefore, the filter circuit presents a very high impedance near the antiresonant frequency of the series resonators 530, 540 while presenting a very low impedance near the resonant frequency of the parallel resonators 550, 560. Taking advantage of such a characteristic, the ladder filter circuit can obtain a wide filter characteristic ranging from a stop band on a high-frequency side of a passband to a stop band on a low-frequency side of the passband.

As an approach to permit such a ladder filter circuit to achieve an increased attenuation at an attenuation pole, there has been disclosed a resonator provided with an LC circuit comprised of a surface acoustic wave electrode (see, for example, Japanese Unexamined Patent Publication No.9 (1997)-232906). Alternatively, a technique has been disclosed wherein the length of a wire connected to an external element is changed to vary the inductance of the wire itself thereby changing the position of an attenuation pole for adjustment of the attenuation thereof (see, for example, Japanese Unexamined Patent Publication No.11(1999)-55067).

Recently, however, the standards for efficient utilization of radio waves have been established for the mobile communications systems. For instance, the US PCS Standards defines the receive band in the range of 1930 to 1990 MHz and the transmission band in the range of 1850 to 1910 MHz so that a gap between the passbands of a transmitting filter and a receiving filter is 20 MHz. Thus, the transmission band is formed adjacent to the receive band. Therefore, the receiving filter is required to ensure a sufficient amount of attenuation and a low insertion loss in the passband while maintaining the wideness of the passband.

This requires a steep characteristic curve on the lower side (left-shoulder side) of the receive band, the curve extending from the stop band to the passband. Unfortunately, neither of the techniques disclosed in Japanese Unexamined Patent Publications Nos.9(1997)-232906 and 11(1999)-55067 is capable of achieving the filter characteristics featuring the increased passband and the steep characteristic curve on the left-shoulder side thereof.

BRIEF SUMMARY OF THE INVENTION

It is an object of the invention to provide a surface acoustic wave filter capable of achieving a sufficiently steep characteristic curve on a lower side of a passband while maintaining the wideness of the passband without use of any specific LC-circuit.

The surface acoustic wave filter according to the invention comprises a series resonator group including a plurality of surface acoustic wave electrodes formed on a surface of a piezoelectric substrate and electrically disposed in series between an input terminal and an output terminal; and a parallel resonator group including a plurality of surface acoustic wave electrodes individually electrically disposed in parallel between an input- or output-terminal of the individual electrodes of the series resonator group and a ground electrode, wherein a resonant frequency formed by a part of the surface acoustic wave electrodes among the surface acoustic wave electrodes of the parallel resonator group is lower than an antiresonant frequency formed by the other surface acoustic wave electrodes of the prarallel resonator group, and is higher than a resonant frequency formed by the other surface acoustic wave electrodes of the parallel resonator group.

According to the invention, the surface acoustic wave filter is characterized in that a part number of the surface acoustic wave electrodes out of the surface acoustic wave electrodes of the parallel resonator group has a Q-value deteriorative configuration for attaining a degradation of Q value than the Q value of the other surface acoustic wave electrodes of the parallel resonator group.

According to the arrangement of the invention, the filter has such filter characteristics that a new attenuation pole is formed between an attenuation pole on a low frequency side and a low end of a passband. Thus, the filter attains a more steep characteristic curve on the lower side of the passband while maintaining the wideness of the passband, ensuring a satisfactory shoulder characteristic curve.

A specific configuration according to the invention will hereinbelow be described with reference to the accompanying drawings.

DETAILED DESCRIPTION OF THE INVENTION

Figure 1:
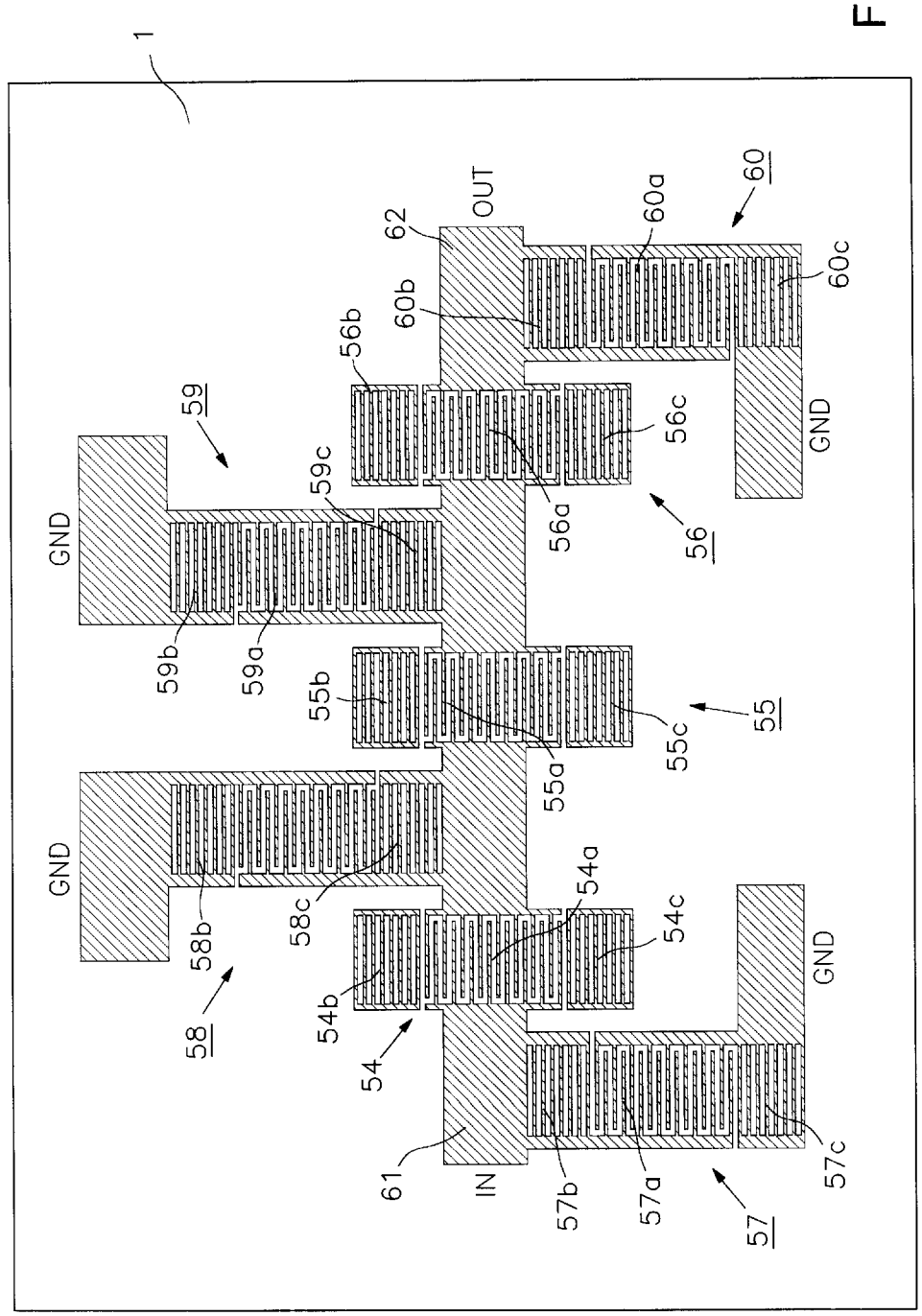
FIG. 1 is a plan view showing a surface acoustic wave filter according to an embodiment of the invention.

Referring to FIG. 1, a surface acoustic wave filter has an arrangement wherein a series resonator group and a parallel resonator group are formed on a primary surface of a piezoelectric substrate 1, the series resonator group including a plurality of surface acoustic wave electrodes 54, 55, 56 electrically disposed in series between an input terminal (IN) and an output terminal (OUT), the parallel resonator group including a plurality of surface acoustic wave electrodes 57, 58, 59, 60 individually electrically disposed in parallel between the interconnection between the input and output terminals (IN, OUT) and a ground electrode (GND). Hereinafter, each of the surface acoustic wave electrodes 54–56 of the series resonator group will be referred to as "a series resonator" whereas each of the surface acoustic wave electrodes 57–60 of the parallel resonator group will be referred to as "a parallel resonator".

The surface acoustic wave electrodes 54, 55, 56 of the series resonator group and the like electrodes 57, 58, 59, 60 of the parallel resonator group individually have a comb-shaped interdigital transducer (hereinafter referred to as "IDT") 54a, . . . , 60a at its center, each transducer sandwiched between a respective pair of reflectors 54b, 54c; 55b, 55c; . . . 60b, 60c.

The piezoelectric substrate 1 is comprised of quartz, lithium niobate, lithium tantalate, lithium tetraborate or the like, which is cut into a rectangular shape in a manner that the substrate 1 may have a predetermined cutting angle and a predetermined propagation direction.

On the other hand, the surface acoustic wave electrodes 54, 55, 56 and the like electrodes 57, 58, 59, 60 are each comprised of an aluminum thin film which is deposited on the substrate in a thickness of 0.1 to 0.3 $\mu$m and a predetermined pattern. In the IDTs 54a–60a and the reflectors 54b, 54c, 55b, 55c . . . 60b, 60c disposed on the opposite sides of the corresponding IDTs, a width of each electrode finger and an inter-finger gap are defined as substantially ¼ of the wavelength $\lambda$ of a surface acoustic wave.

The configuration of the IDTs 54a–60a will be described by way of an example of the surface acoustic wave electrodes 57–60 of the parallel resonator group.

Figure 2B:
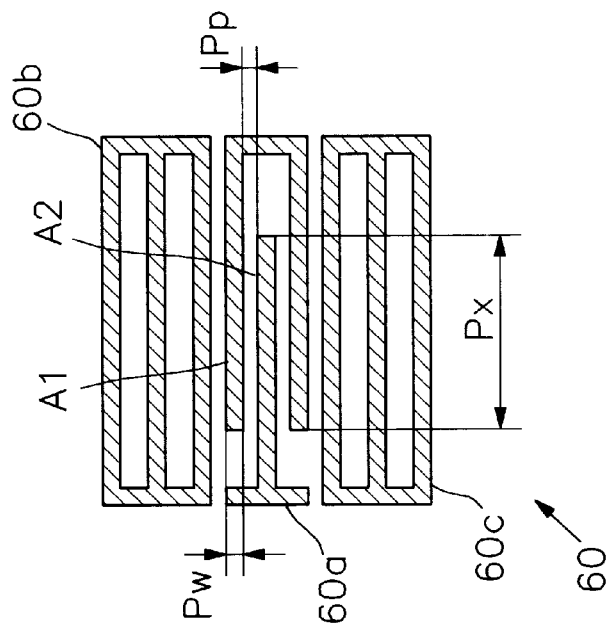
FIG. 2B is a plan view showing a configuration of a surface acoustic wave electrode 60.
Figure 2A:
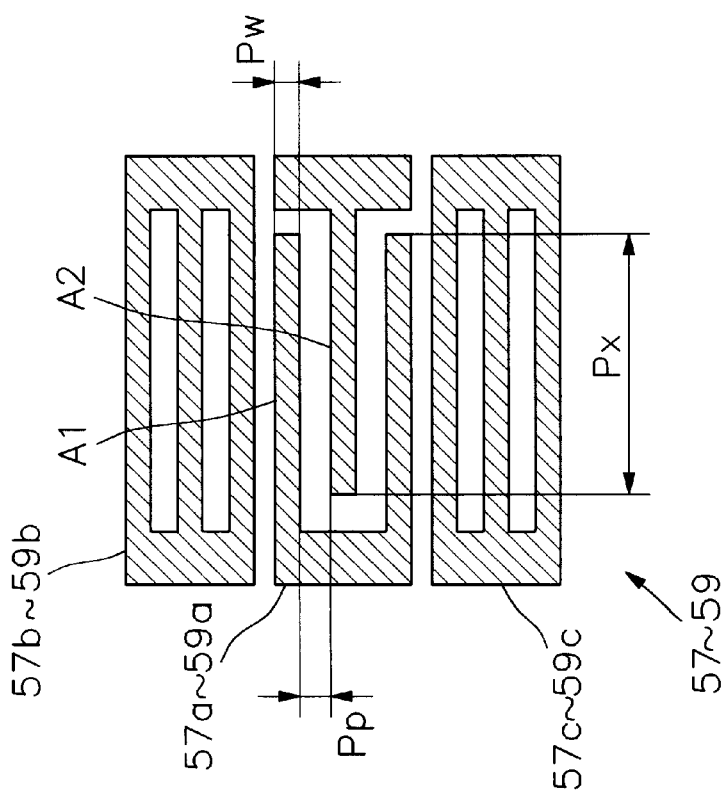
FIG. 2A is a plan view showing a configuration of each of surface acoustic wave electrodes 57–59.

As shown in FIGS. 2A–2B, the IDTs 57a–60a have a configuration wherein an electrode finger A1 is interdigitated with an electrode finger A2, the electrode fingers aligned along a direction perpendicular to the propagation direction of the surface acoustic wave generated. For instance, the electrode fingers A1, A2 are designed to have an electrode width Pw substantially equal to an inter-finger gap Pp therebetween.

Although the embodiment of the invention defines the electrode width Pw and the inter-finger gap Pa as being substantially equal to each other, the invention is not necessarily be limited to this. A similar effect of the invention may be obtained even if the electrode width Pw differs from the inter-finger gap Pp.

In FIG. 1, indicated at 61 is an input terminal and at 62 an output terminal. The IDTs 54a–56a are electrically disposed in series between the input terminal 61 and the output terminal 62. On the other hand, the IDTs 57a–60a each have a one end thereof connected to the interconnection between the input and the output terminals via a corresponding reflector 57b, 58c, 59c, 60b while having the other end thereof connected to a corresponding ground electrode (GND) via a corresponding reflector 57c, 58b, 59b, 60c.

Figure 3:
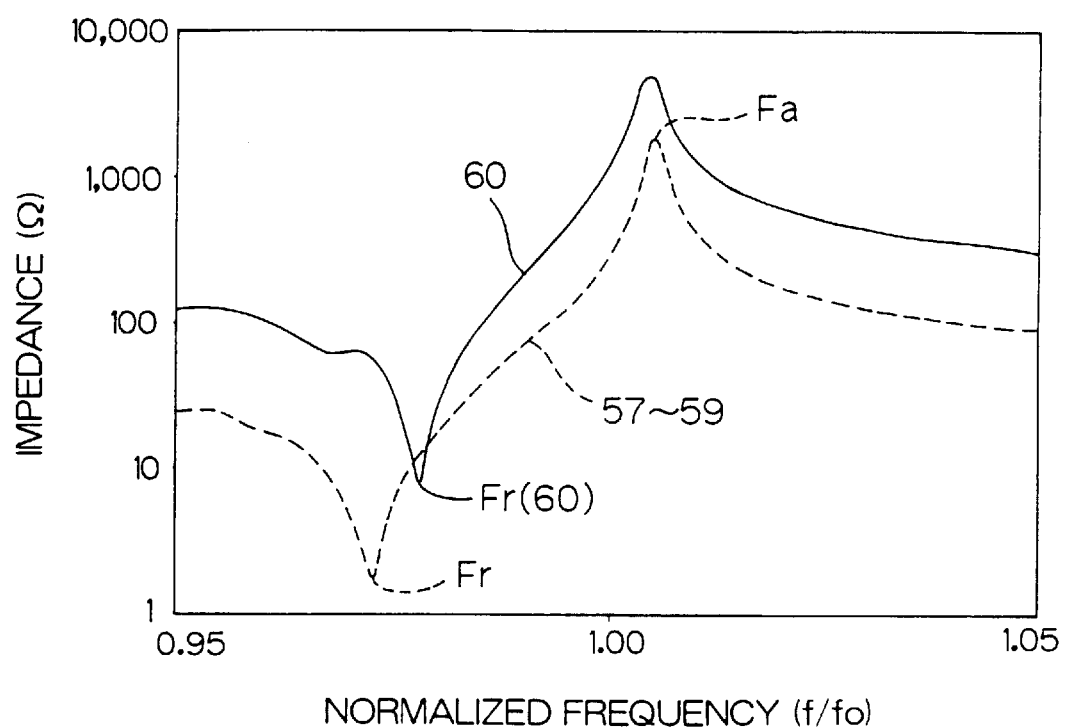
FIG. 3 is a graph representing resonance characteristics of the surface acoustic wave electrodes 57–59 and of the surface acoustic wave electrode 60.

Out of the surface acoustic wave electrodes 57–60 of the parallel resonator group, the electrode 60 has resonance characteristics presenting a Q-value deterioration configuration, as shown in FIG. 3, wherein the obtained Q value is deteriorated. In addition to the Q-value deterioration configuration, the electrode 60 has a resonant frequency Fr(60) which is lower than an antiresonant frequency Fa of the electrodes 57–59 of the parallel resonator group and higher than a resonant frequency Fr of the electrodes 57–59.

The Q value is generally expressed as Q=2πFL/R (F: resonant frequency, L: inductance, R: resonant resistance). The present inventors have found that a steep left shoulder representing the filter characteristics in a passband of the filter can be obtained by approximating the resonant frequency Fr(60) of the electrode 60 to the passband of the filter and by lowering the Q value obtained by the electrode 60.

The Q value of the electrode 60 may be lowered to such a degree that an insertion loss of the resonance characteristics of the electrode 60 is so degraded as to approximate an impedance at the resonant frequency Fr(60) thereof to a locus between the resonant frequency Fr and the antiresonant frequency Fa of the resonance characteristics of the electrodes 57–59.

The Q-value deterioration configuration may be obtained by increasing the resonant resistance R. A high resonant resistant may be attained by the following specific configuration.

The surface acoustic wave electrode 60 may be decreased in the number of electrode finger pairs A1, A2 as compared with that of each of the surface acoustic wave electrodes 57–59, thereby achieving a higher resonance resistance R for degrading the Q value.

Furthermore, the electrode 60 may have the pair of electrode fingers A1, A2 interdigitated by a smaller length Px than the length Px of each of the other electrodes 57–59, thereby achieving an increased resonance resistance R for degrading the Q value (see FIGS. 2A and 2B).

Figure 4:
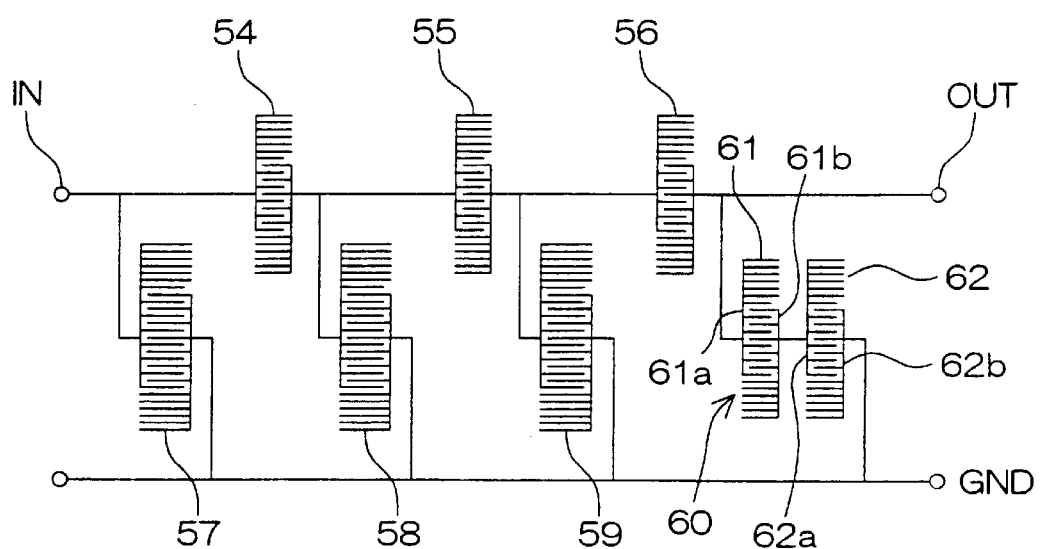
FIG. 4 is a circuit diagram explanatory of a surface acoustic wave filter according to another embodiment of the invention.

Alternatively, as shown in FIG. 4, the surface acoustic wave electrode 60 may comprise sub-electrodes 61, 62 interconnected in series, each sub-electrode comprising comb electrodes. The sub-electrode 61 has an electrode 61a connected to the interconnection between the input terminal (IN) and the output terminal (OUT) and an electrode 61b in opposed relation with the electrode 61a. On the other hand, the sub-electrode 62 has an electrode 62a connected to the electrode 61b and an electrode 62b opposing the electrode 62a and connected to the ground electrode. Thus, the electrodes 61a, 61b, 62a, 62b are connected in series. These electrodes connected in series contribute to a higher resonance resistance R than that of the surface acoustic wave electrode 60 of FIG. 1, resulting in a greater degradation of the Q value.

The following method may be taken to permit the surface acoustic wave electrode 60 to form the resonant frequency Fr(60) which is lower than the antiresonant frequency Fa and higher than the resonant frequency Fr formed by each of the other surface acoustic wave electrodes 57–59 of the parallel resonator group. As shown in FIG. 2, the surface acoustic wave electrodes 57–60 of the parallel resonator group may be configured to have a greater pitch of the electrode finger than that of the electrode 60, the pitch of the electrode finger defined as a sum (Pw+Pp) of the width Pw of the electrode finger and the inter-finger gap Pp.

In this case, any of the following approaches may be taken: (1) the surface acoustic wave electrodes 57–60 of the parallel resonator group are each configured to have the electrode fingers substantially equal in the width Pw and to be varied in the inter-finger gap Pp; (2) the surface acoustic wave electrodes are each configured to have substantially the same inter-finger gap Pp and to be varied in the width Pw of the electrode finger; and (3) the surface acoustic wave electrodes 57–60 of the parallel resonator group are each configured to be varied in the width Pw of the electrode finger and in the inter-finger gap Pp.

Alternatively, each of the other surface acoustic wave electrodes 57–59 of the parallel resonator group may be configured to have a greater metallization ratio (defined herein as a ratio of the width of the electrode finger Pw vs the pitch of the electrode finger (Pw/(Pp+Pw)) than that of the surface acoustic wave electrode 60. For example, the surface acoustic wave electrodes 57–59 shown in FIG. 2A may each have the electrode fingers A1, A2, 0.500 μm in width Pw and an inter-finger gap Pp of 0.500 μm, so that Pw/(Pp+Pw)=0.5. On the other hand, the surface acoustic wave electrode 60 may have the electrode fingers 0.400 μm in width Pw and an inter-finger gap Pp of 0.600 μm, so that Pw/(Pp+Pw)=0.4. Thus, the former electrodes may each have a different resonant frequency from that of the latter electrode 60.

Otherwise, the surface acoustic wave electrode 60 may have a smaller thickness than that of the other surface acoustic wave electrodes 57–59 of the parallel resonator group.

In the foregoing embodiment, a single surface acoustic wave electrode 60 of the parallel resonator group forms an attenuation pole at a higher frequency than that formed by each of the other surface acoustic wave electrodes 57–59 of the parallel resonator group. However, the invention should not be limited to this. A similar effect may be obtained by an arrangement wherein two or more of the surface acoustic wave electrodes of the parallel resonator group may each form an attenuation pole on the higher side.

In the prior art, the surface acoustic wave electrodes 57–60 of the parallel resonator group are employed for forming the attenuation pole at a lower side of the passband. In contrast, the surface acoustic wave filter of the invention is arranged such that a single surface acoustic wave electrode 60 of the parallel resonator group has the Q-value deterioration configuration and the resonant frequency Fr(60) which is lower than the antiresonant frequency Fa and higher than the resonant frequency Fr of the other surface acoustic wave electrodes 57–59 of the group. Therefore, the inventive filter has filter characteristics wherein an additional attenuation pole is formed between the attenuation pole on the lower frequency side and the low end of the passband. This provides the filter with a wide passband as well as a steeper characteristic curve on the lower side of the passband, which results in a satisfactory shoulder of the curve representing the filter characteristics. Furthermore, there is little change in the attenuation characteristics in the passband so that the conventional design method may be used as it is.

In the conventional method, the inductance of an aluminum wire or a gold wire as an external electrode wire is varied by changing the length of the wire thereby ensuring the amount of attenuation on the lower side of the attenuation band. Unfortunately, the pole position is subtly shifted depending upon the connection conditions, resulting in a decreased yield as determined by the characteristic test.

In contrast, the invention does not rely upon such a technique to obtain a steep characteristic curve on the lower side of the shoulder characteristic curve in the passband and hence, ensures a stable yield.

EXAMPLE 1

Example 1 employed a 42° Y-X lithium tantalate substrate as the piezoelectric substrate 1. As shown in the connection diagram of FIG. 1, the surface acoustic wave electrodes 54, 55, 56 of the series resonators and the surface acoustic wave electrodes 57, 58, 59, 60 of the parallel resonators were laid on a surface of the substrate 1, all the electrodes formed from aluminum or an aluminum alloy. Thus was fabricated a ladder SAW filter having a center frequency of 1.96 GHz.

Assumed that $\lambda$ represents the wavelength of a surface acoustic wave. The surface acoustic wave electrodes 54, 55, 56 of the series resonators each had an overlapping width $Px=10-15 \lambda$, the surface acoustic wave electrodes 57, 58, 59 of the parallel resonators each having an overlapping width $Px=30 \lambda$, the surface acoustic wave electrode 60 having an overlapping width $Px=20 \lambda$.

The surface acoustic wave electrodes 54, 55, 56 of the series resonators each had 95 pairs of electrodes, the surface acoustic wave electrodes 57, 58, 59 of the parallel resonators each having 45 pairs of electrodes, the surface acoustic wave electrode 60 having 15 pairs of electrodes.

The surface acoustic wave electrodes 57, 58, 59 of the parallel resonators had a width Pw of the electrode finger and an inter-finger gap Pp of $Pp=Pw=0.503 \mu m$, whereas the surface acoustic wave electrode 60 had a width Pw of the electrode finger and an inter-finger gap Pp of $Pp=Pw=0.500 \mu m$. That is, the electrode 60 was smaller in the width of the electrode finger and in the inter-finger gap than the electrodes 57–59.

Incidentally, the surface acoustic wave electrodes 54, 55, 56 of the series resonators had a width Pw of the electrode finger and an inter-finger gap Pp of $Pp=Pw=0.4845 \mu m$. That is, the width of the electrode finger Pw is defined to be as long as the inter-finger gap Pp.

Figure 5:
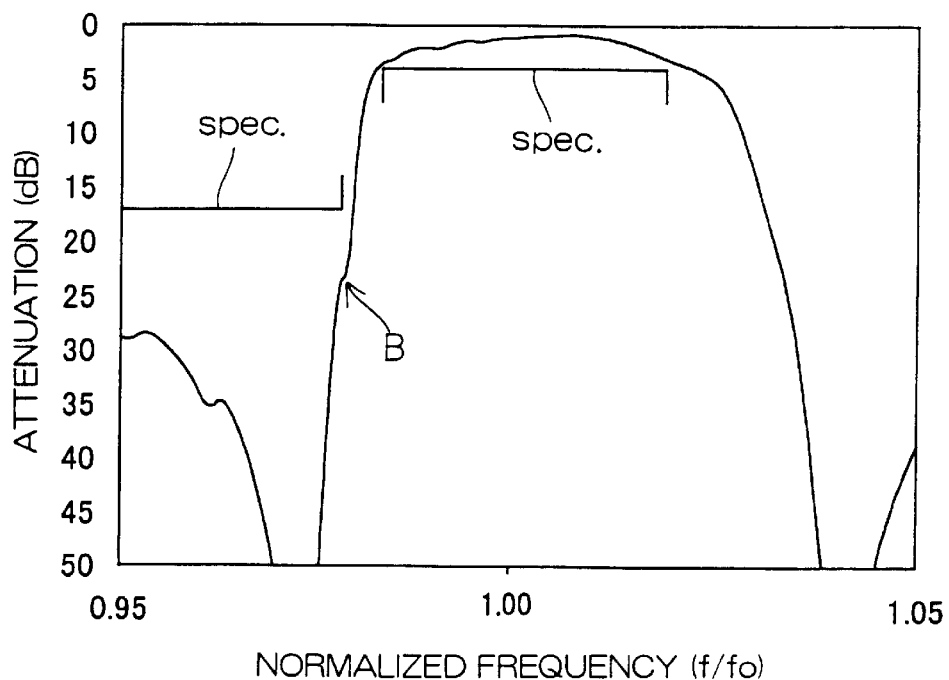
FIG. 5 is a graph representing attenuation characteristics representative of filter characteristics of the invention.

FIG. 5 graphically represents filter characteristics of the surface acoustic wave filter thus formed. In FIG. 5, the ordinate is the attenuation (dB; 5 dB/div) and the abscissa is the normalized frequency (center frequency f0: 1960 MHz, span: 196 MHz).

Referring to FIG. 5, the surface acoustic wave electrodes 57–59 of the parallel resonators form an attenuation pole in the vicinity of a normalized frequency of 0.97. In addition, the surface acoustic wave electrodes 54, 55, 56 of the series resonators form an attenuation pole in the vicinity of a normalized frequency of 1.04.

As is also seen in FIG. 5, the surface acoustic wave electrode 60 of the parallel resonator forms an attenuation pole B on a higher side of a pole on a low-frequency side of the passband. It is appreciated that the shoulder characteristic curve is steep on the lower side of the passband, resulting in wide passband characteristics.

COMPARATIVE EXAMPLE 1

In Comparative Example, the surface acoustic wave electrodes 54, 55, 56 of the series resonators each had an overlapping width $Px=10$ to $15 \lambda$ whereas the surface acoustic wave electrodes 57–60 of the parallel resonators each had an overlapping width $Px=30 \lambda$. The Pw and Pp of the electrodes 57–60 of the parallel resonators were defined as $Pw=Pp=0.503 \mu m$.

The surface acoustic wave electrodes 54, 55, 56 of the series resonators each had 95 pairs of electrodes, whereas the surface acoustic wave electrodes 57–60 of the parallel resonators each had 45 pairs of electrodes. The width of the electrode Pw was defined to be the same as the inter-finger gap Pp.

Figure 6:
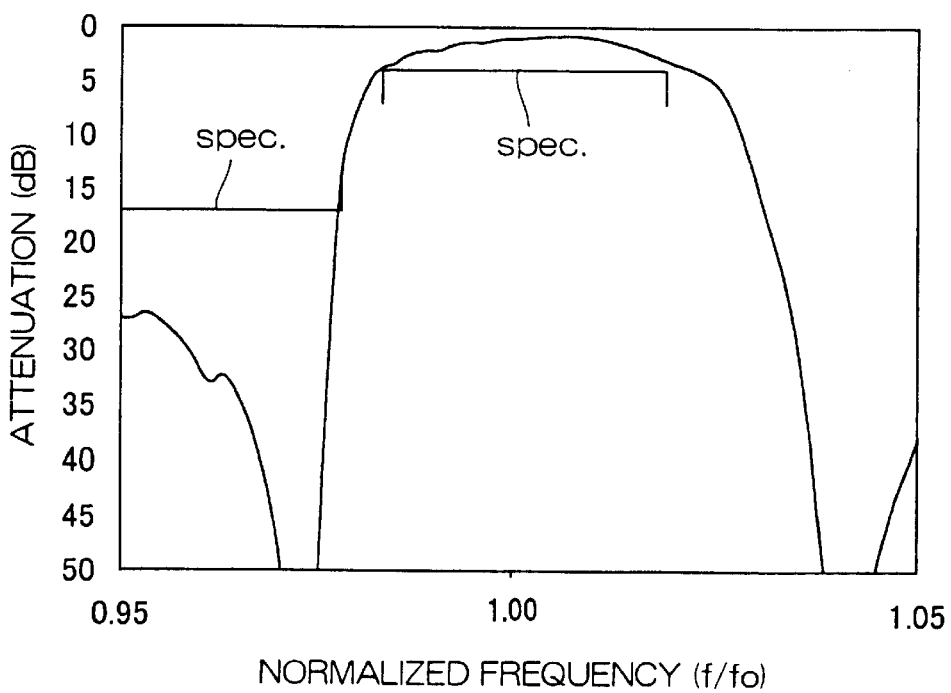
FIG. 6 is a graph representing attenuation characteristics representative of filter characteristics of a comparative example.

FIG. 6 graphically represents filter characteristics of the surface acoustic wave filter of this comparative example. In FIG. 6, the ordinate is the attenuation (dB; 5 dB/div) and the abscissa is the normalized frequency (center frequency f0: 1960 MHz, span: 196 MHz).

FIG. 6 shows that the obtained filter characteristics fail to adequately satisfy the specifications for the shoulder curve on the lower side of the passband (represented by an open-ended rectangular symbol in FIG. 6).

EXAMPLE 2

The test was conducted under the same conditions as in Example 1, except that the surface acoustic wave electrode 60 shown in FIG. 1 was configured as shown in FIG. 4 (the electrode 60 comprised of the sub-electrodes 61, 62 interconnected in series). Incidentally, both the sub-electrodes 61, 62 had an overlapping width $Px=20 \lambda$, as well as a width of the electrode finger Pw and an inter-finger gap Pp of $Pw=Pp=0.5 \mu m$. The electrode 60 included 45 pairs of electrodes.

Figure 7:
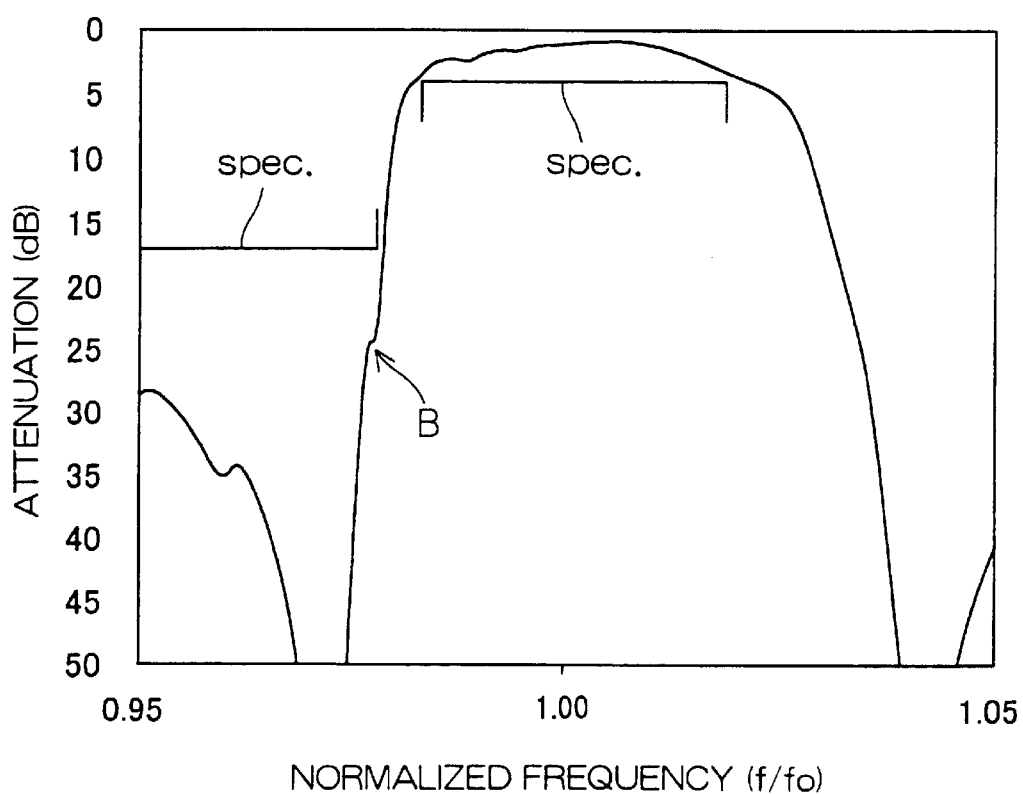
FIG. 7 is a graph representing attenuation characteristics representative of filter characteristics of a surface acoustic wave filter according to yet another embodiment of the invention.
Figure 8:
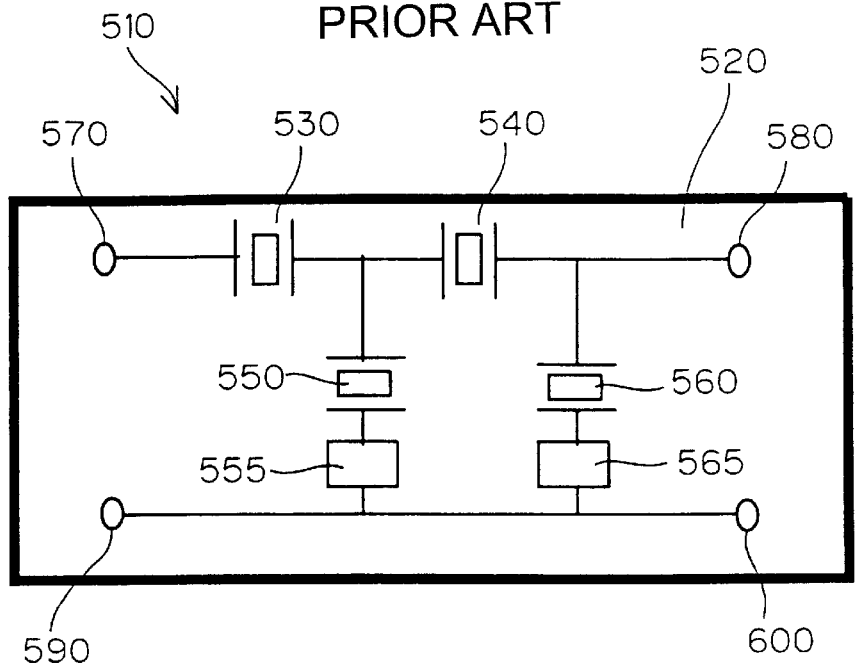
FIG. 8 is a schematic plan view illustrating a conventional surface acoustic wave filter.
Figure 9:
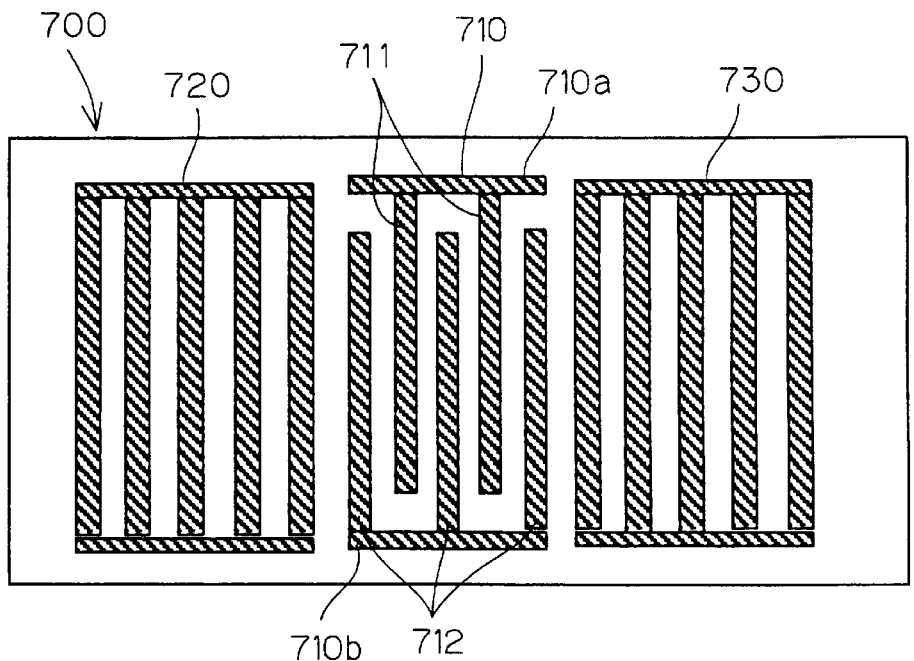
FIG. 9 is a plan view illustrating a 1-port surface acoustic wave electrode.

FIG. 7 shows filter characteristics determined by the test. The test results show that the surface acoustic wave electrode 60 of the series resonator comprised of the sub-electrodes 61, 62 attains a greater resonant resistance than the surface acoustic wave electrode 60 of FIG. 1, so that a greater degradation of the Q value than the other surface acoustic wave electrodes 57–59 of the parallel resonator group results. Furthermore, Example-2 electrode 60 attains a resonant frequency which is lower than the antiresonant frequency and higher than the resonant frequency of the other surface acoustic wave electrodes 57–59 of the group. Consequently, a new attenuation pole B is formed on the left-side shoulder characteristic curve in the passband, resulting in a steep characteristic curve on the lower side of the passband.

What is claimed is:

1. A surface acoustic wave filter comprising:

a series resonator group including a plurality of surface acoustic wave electrodes formed on a surface of a piezoelectric substrate and electrically disposed in series between an input terminal and an output terminal, and a parallel resonator group including a plurality of surface acoustic wave electrodes individually electrically disposed in parallel between an input- or output-terminal of the individual surface acoustic wave electrodes of the series resonator group and a ground electrode, wherein a resonant frequency formed by a part of surface acoustic wave electrodes among the surface acoustic wave electrodes of the parallel resonator group is lower than an antiresonant frequency formed by the other surface acoustic wave electrodes of the parallel resonator group and is higher than a resonant frequency formed by the other surface acoustic wave electrodes of the parallel resonator group, wherein the surface acoustic wave electrode comprises comb electrodes opposed to each other to have their electrode fingers interdigitated with each other, and wherein the other surface acoustic wave electrodes of the parallel resonator group have a greater ratio of the width to the pitch of the electrode finger than the part of the surface acoustic wave electrodes of the parallel resonator group.

2. A surface acoustic wave filter according to claim 1, wherein the other surface acoustic wave electrodes of the parallel resonator group have a greater pitch of the electrode finger than the part of the surface acoustic wave electrodes of the parallel resonator group.

3. A surface acoustic wave filter comprising:

a series resonator group including a plurality of surface acoustic wave electrodes formed on a surface of a piezoelectric substrate and electrically disposed in series between an input terminal and an output terminal, and a parallel resonator group including a plurality of surface acoustic wave electrodes individually electrically disposed in parallel between an input- or output-terminal of the individual surface acoustic wave electrodes of the series resonator group and a ground electrode, wherein a resonant frequency formed by a part of surface acoustic wave electrodes among the surface acoustic wave electrodes of the parallel resonator group is lower than an antiresonant frequency formed by the other surface acoustic wave electrodes of the parallel resonator group and is higher than a resonant frequency formed by the other surface acoustic wave electrodes of the parallel resonator group, wherein the surface acoustic wave electrode comprises comb electrodes opposed to each other to have their electrode fingers interdigitated with each other, and wherein the part of the surface acoustic wave electrodes of the parallel resonator group has a smaller electrode thickness than the other surface acoustic wave electrodes of the parallel resonator group.

4. A surface acoustic wave filter comprising:

a series resonator group including a plurality of surface acoustic wave electrodes formed on a surface of a piezoelectric substrate and electrically disposed in series between an input terminal and an output terminal, and a parallel resonator group including a plurality of surface acoustic wave electrodes individually electrically disposed in parallel between an input- or output-terminal of the individual surface acoustic wave electrodes of the series resonator group and a ground electrode, wherein a part of the surface acoustic wave electrodes among the surface acoustic wave electrodes of the parallel resonator group has a Q-value deterioration configuration for attaining a deterioration of Q value relative to the other surface acoustic wave electrodes of the parallel resonator group, and wherein a resonant frequency formed by the part number of the surface acoustic wave electrodes out of the surface acoustic wave electrodes of the parallel resonator group is lower than an antiresonant frequency formed by the other surface acoustic wave electrodes of the parallel resonator and is higher than a resonant frequency formed by the other surface acoustic wave electrodes of the parallel resonator group.

5. A surface acoustic wave filter according to claim 4, wherein the surface acoustic wave electrode comprises comb electrodes opposed to each other to have their electrode fingers interdigitated with each other, and wherein the part of the surface acoustic wave electrodes of the parallel resonator group comprises a plurality of sub-electrodes interconnected in series, the sub-electrode comprising comb electrodes.

6. A surface acoustic wave filter according to claim 4, wherein the surface acoustic wave electrode comprises comb electrodes opposed to each other to have their electrode fingers interdigitated with each other, and wherein the part of the surface acoustic wave electrodes of the parallel resonator group has a smaller number of electrode finger pairs than the other surface acoustic wave electrodes of the parallel resonator group.

7. A surface acoustic wave filter according to claim 4, wherein the surface acoustic wave electrode comprises comb electrodes opposed to each other to have their electrode fingers interdigitated with each other, and wherein the part of the surface acoustic wave electrodes of the parallel resonator group has its electrode fingers interdigitated with each other by a smaller overlapping length than the other surface acoustic wave electrodes of the parallel resonator group.

* * * * *